(12) United States Patent
Lai et al.

(10) Patent No.: US 9,051,649 B2
(45) Date of Patent: Jun. 9, 2015

(54) SEMICONDUCTOR FILM DEPOSITION APPARATUS AND METHOD WITH IMPROVED HEATER COOLING EFFICIENCY

(71) Applicant: Taiwan Semiconductor Manufacturing Co., Ltd., Hsin-Chu (TW)

(72) Inventors: Pao-Tsung Lai, Tainan (TW); Chia-Chiun Chen, Fengshan (TW); Ching-Chung Cheng, Kaohsiung (TW); Chi-Feng Chen, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/792,882

(22) Filed: Mar. 11, 2013

(65) Prior Publication Data
US 2014/0256129 A1    Sep. 11, 2014

(51) Int. Cl.
| | |
|---|---|
| C23C 14/00 | (2006.01) |
| C25B 11/00 | (2006.01) |
| C25B 13/00 | (2006.01) |
| C23C 14/54 | (2006.01) |
| H01L 21/285 | (2006.01) |
| H01L 21/67 | (2006.01) |
| H01L 21/677 | (2006.01) |

(52) U.S. Cl.
CPC .......... *C23C 14/541* (2013.01); *H01L 21/2855* (2013.01); *H01L 21/67017* (2013.01); *H01L 21/67109* (2013.01); *H01L 21/6719* (2013.01); *H01L 21/67207* (2013.01); *H01L 21/67745* (2013.01)

(58) Field of Classification Search
CPC .......................... C23C 14/541; H01J 37/32724
USPC ......................................... 204/298.09, 298.12
See application file for complete search history.

(56) References Cited

U.S. PATENT DOCUMENTS

| | | | | |
|---|---|---|---|---|
| 5,449,444 | A  * | 9/1995 | Yoshikawa | 204/192.12 |
| 6,508,885 | B1 * | 1/2003 | Moslehi et al. | 118/728 |
| 6,705,394 | B1 * | 3/2004 | Moslehi et al. | 165/206 |
| 2005/0178335 | A1 * | 8/2005 | Strang et al. | 118/725 |
| 2008/0035306 | A1 * | 2/2008 | White et al. | 165/61 |

* cited by examiner

*Primary Examiner* — Keith Hendricks
*Assistant Examiner* — Ibrahime A Abraham
(74) *Attorney, Agent, or Firm* — Duane Morris LLP

(57) ABSTRACT

Provided is a physical vapor deposition apparatus with one or multiple deposition chambers for depositing films on substrates. The deposition chambers includes a heater and various cooling features to cool the chamber, the heater and the substrate. The sidewalls and top of the chamber are cooled by a cooling feature. The heater includes a cooling plate. A fitted heated cover is disposed between the heater and the substrate. A cooling pipe delivers a coolant throughout the cooling plate and extends in a high spatial density throughout the surface of the cooling plate. The cooling pipe occupies an area of about 14-20% of the area of the cooling plate and no location on the cooling plate surface is greater than about 15-20 mm from the cooling pipe. The cooling pipe cools the heater rapidly and enables deposition operations of long duration and using high power to be carried out.

18 Claims, 5 Drawing Sheets

SEMICONDUCTOR FILM DEPOSITION APPARATUS AND METHOD WITH IMPROVED HEATER COOLING EFFICIENCY

TECHNICAL FIELD

The disclosure relates to semiconductor manufacturing methods and equipment and, more particularly, to improved structures and methods for cooling heaters such as used in film deposition and other semiconductor manufacturing equipment.

BACKGROUND

Various films such as conductive metals, refractory metals and other materials such as semiconductor materials, are deposited using deposition equipment that involves physical vapor deposition, PVD, also known as sputtering. Included among the films deposited using this method are various metals such as aluminum copper, AlCu, aluminum silicon, Alsip, aluminum silicon copper, AlSiCu, aluminum, Al, copper, Cu, and other conductive films. Refractory films such as tungsten, W, tungsten silicide, Wl, tantalum, Ta, titanium, Ti, titanium nitride, TiN, tantalum nitride and various other films represent just a sample of the many different films used in semiconductor manufacturing and formed using physical deposition methods. The thicknesses of the films deposited using these methods vary in various devices. Some devices such as cell phone devices require very thick metal films such as metal films having thicknesses in the range of about 500,000 angstroms.

The amount of film deposited varies with deposition time for a given power and given deposition rate. As such, thicker film requires a longer deposition time and therefore power is applied for a longer duration. Also a higher power produces a thicker film for a fixed deposition duration. The application of power and the PVD deposition operation itself, including the plasma in the PVD operation, causes the sputtering target and the entire chamber to heat up. The temperature is raised for all components within the chamber, including the substrate, e.g. wafer, upon which the film is being deposited. The temperature of the substrate increases with increased process time and increased power.

Included in the deposition chamber is a heater often used to heat the substrate during deposition to a processing temperature.

When the substrate temperature is high due to the heater and/or the power and resulting plasma used in a deposition process, the substrate is prone to stick to other components in the chamber, and this is especially true when a thick film is being deposited upon the substrate surface.

When the deposition operation is concluded, the heater needs to be cooled to cool the substrate and in order to remove the substrate from the chamber. If the heater cannot be efficiently cooled when the processing is concluded, the substrate sticks on the chuck and its removal can cause deformation or breakage of the substrate.

In order to avoid this sticking phenomenon, films having a thickness greater than a threshold thickness, are deposited in multiple steps, i.e. multiple separate processing operations. The multiple process operations are commonly carried out in different processing chambers.

It would be desirable to deposit films to any desired thickness in one operation and to cool the components efficiently and quickly upon conclusion of the deposition process.

BRIEF DESCRIPTION OF THE DRAWING

The present disclosure is best understood from the following detailed description when read in conjunction with the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing.

DETAILED DESCRIPTION

Figure 1:
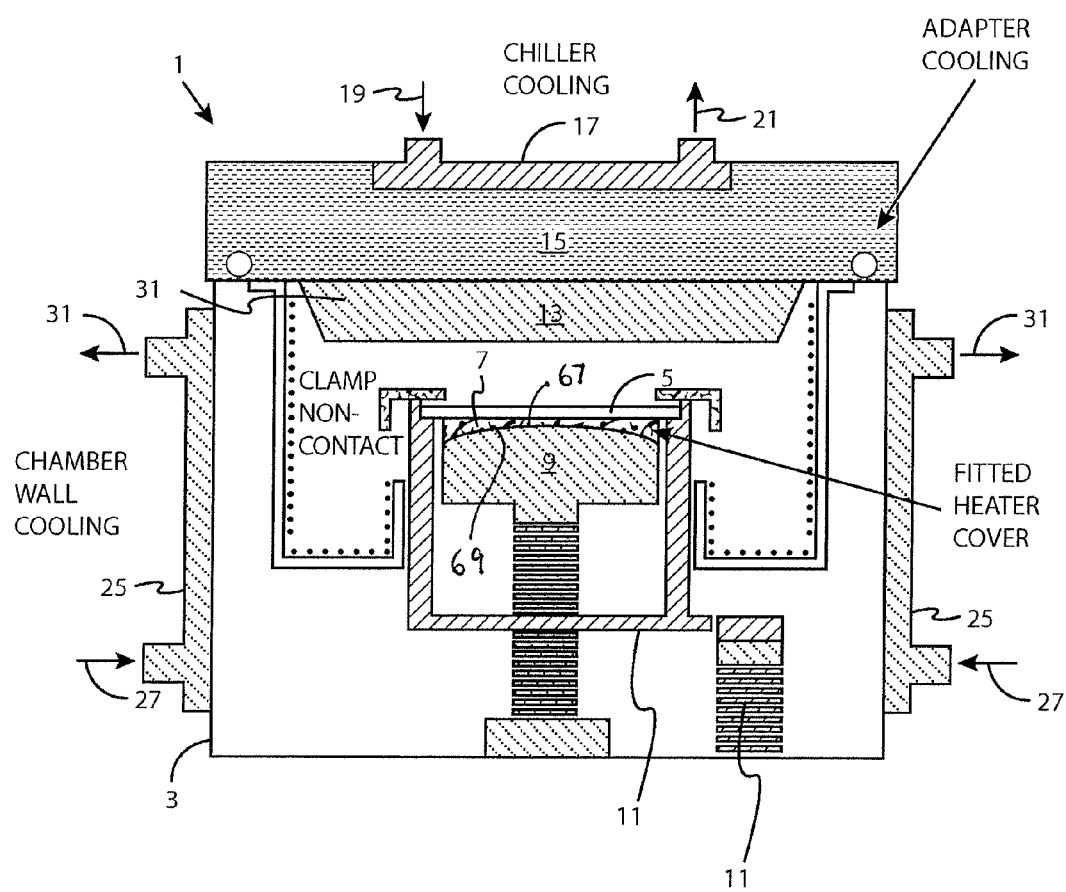
FIG. 1 is a schematic view of a deposition chamber according to an embodiment of the disclosure.

The disclosure provides a PVD, physical vapor deposition, i.e. sputtering apparatus with one or multiple deposition chambers. Each of the deposition chambers includes a sputtering target, a power source, a heater and various means to cool the chamber. The sidewalls of the chamber are cooled by one cooling feature with superior cooling capabilities. The top of the chamber is cooled by another cooling feature with superior cooling capabilities. The heater includes a cooling plate within the heater. A fitted heated cover is disposed between the heater and the substrate upon which the film is being deposited. The cooling plate includes a cooling pipe or other conduit that delivers chilled water or another coolant throughout the cooling plate and the cooling pipe extends throughout all areas of the surface of the cooling plate and occupies an area that is about 2.67% to about 14.33% of the area of the cooling plate in one embodiment but the cooling pipe or conduit occupies an even greater portion of the cooling plate in other embodiments. One or more chillers or other coolant delivery systems deliver coolant to the cooling pipe and other cooling features. This cooling pipe feature provides stability during the deposition operation and enables the heater to cool rapidly after a deposition operation which enables deposition operations of long duration and using high power to be carried out. In this manner, the advantage of utilizing an extended deposition duration and/or an increased deposition power provides for forming very thick films in one deposition operation and in one deposition chamber.

The disclosure also provides a method for depositing a thick film. In some embodiments, the disclosure provides a method for depositing a metal film having a thickness of at least about 250K angstroms in a continuous metal deposition operation. In some embodiments, the disclosure provides a method for depositing a metal film having a thickness greater than about 400,000-500,000 angstroms in a continuous metal deposition operation in a single metal deposition chamber whereby a power of about 6 kw to about 20 kw is applied to the deposition target, and a WPH ranging from about 13 pieces/hour to about 25 pieces/hour, is achieved. In some embodiments, a power of greater than 15 kw is applied to the deposition target. A reduced grain size and an improvement in grain size uniformity is achieved. An average grain size of about 1.22 um is achieved in some embodiments. In one embodiment, a run of 50 substrates was carried out and a grain size of about 1.15 um was achieved for the first substrate, a grain size of about 1.24 um was achieved for the 25th substrate and a grain size of about 1.27 was achieved for 50th substrate. This demonstrates a consistency of average grain size throughout a production run trial. In some embodiments, the method provides a deposited film having a range of grain size of about 0.12 um. The deposition of the film to such a great thickness in one continuing deposition operation in one chamber at a sufficiently high deposition rate is achievable because of an increased cooling efficiency of the heater and deposition chamber. The improved cooling efficiency provided according to the disclosure provides for rapid cooling of the heater after the conclusion of the deposition process and enables the substrate to be removed without warpage or breakage.

The improved cooling efficiency of the heater is produced by an increased area occupied by the cooling loop on the heater and a high volume of coolant flowing through the heater. The high volume is attributable to larger cross-sectional area of the cooling conduit and a greater area occupied by the cooling loop on the heater, i.e. a greater spatial density on the cooling plate of the heater.

Now turning to FIG. 1, deposition chamber unit 1 includes chamber 3. In some embodiments, deposition chamber unit 1 represents one deposition chamber in a multi-chamber film deposition tool. Wafer 5 is disposed on fitted heater cover 7, which is positioned over heater 9 and separates wafer 5 from heater 9. Heater 9 includes an improved cooling efficiency as will be shown by the cooling plate and the cooling loops shown in FIGS. 2A-2F. Still referring to FIG. 1, mechanical wafer lift mechanism 11 lifts wafer 5 into position on fitted heater cover 7. Wafer 5 rests directly on fitted heater cover 7 in some embodiments. Fitted heater cover 7 is formed of material such as stainless steel, but other suitable metal or ceramic materials are used in other embodiments. FIG. 1 shows that fitted heater cover 7 includes a concave lower surface 67 disposed directly on heater 9 which includes convex upper surface 69. Fitted heater cover 7 includes an opposed planar top surface 71 upon which wafer 5 is directly disposed. Sputtering target 13 is retained by a sputtering target retaining member and positioned over wafer 5. Various sputtering targets for sputtering various materials are used in various embodiments. In some embodiments, sputtering target 13 is a metal. Metals such as aluminum, aluminum copper, copper, aluminum silicon, aluminum silicon copper, and various other suitable conductive materials used in semiconductor manufacturing are sputtered in various embodiments. In other embodiments, sputtering target 13 represents refractory materials such as tantalum, titanium, tungsten, rubidium, molybdenum, tantalum nitride, titanium nitride and various other suitable refractory metals. In still other embodiments, sputtering target 13 represents dielectric materials.

Adapter 15 covers chamber 3 and includes cooling loop 17. Cooling loop 17 includes inlet coolant 19 and outlet coolant 21. In some embodiments, inlet coolant 19 is water at about 10° C., but coolants such as Gradient HT-70 or other suitable coolants, and other temperatures are used in other embodiments. Cooling loop 17 includes coolant flowing through conduits, trenches, pipes or grooves having diameters of greater than about 10 mm or about 12-15 mm in some embodiments but other dimensions are used in other embodiments. Chamber wall cooling member 25 includes inlet coolant 27 and outlet coolant 31. In some embodiments, inlet coolant 27 is water, and in other embodiments, other suitable coolants such as Gradient HT-70 are used. Other suitable coolants are used in other embodiments. In some embodiments, inlet coolant 27 is delivered from a chiller at about 10° C., but other temperatures are used in other embodiments. Chamber wall cooling member 25 includes conduits, trenches, pipes or grooves having diameters of about 10 mm or about 12-15 mm in some embodiments but other dimensions are used in other embodiments.

Deposition chamber unit 1 includes or is coupled to a suitable DC power source, not shown, and various powers are used in various deposition processes.

Heater 9 includes a cooling plate. The cooling plate includes a cooling loop, e.g. pipe, having an inlet and outlet (not shown). In some embodiments, the coolant that circulates within heater 9 is chilled water, but other coolants such as Gradient HT-70 and other commercially available and suitable coolants are used in other embodiments. In some embodiments, the chilled water that circulates through the cooling loop within heater 9 is delivered at about 10° C., but other temperatures within the range of about 5° C.-25° C., are used in other embodiments. Various chillers and other coolant delivery systems are used in various embodiments.

Figure 2A:
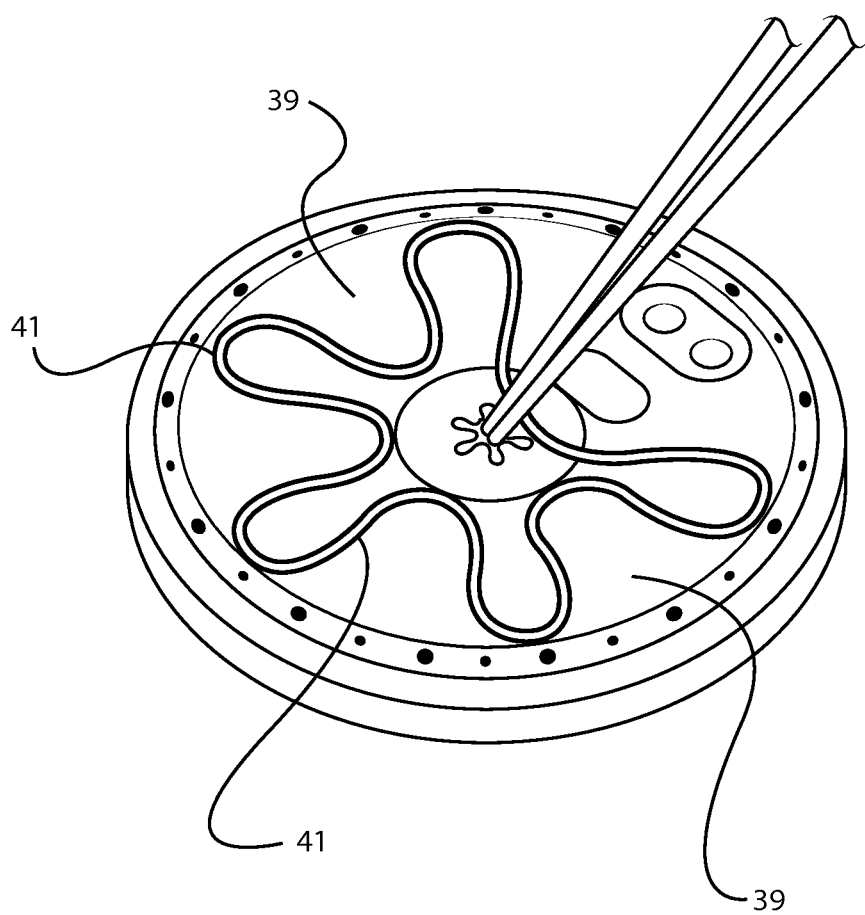
FIG. 2A is a top, perspective view showing an embodiment of a heater cooling loop according to the disclosure.

FIG. 2A shows further details of heater 9. Cooling plate 39 is disposed within heater 9 and includes cooling loop 41. In some embodiments, cooling plate 39 is about the same size and shape as the wafer upon which deposition is taking place. Cooling plate is located in various locations within heater in various embodiments. In some embodiments, the chamber is sized to accommodate a semiconductor substrate, i.e. wafer size of 200 or 300 mm, but the chamber is sized to accommodate other wafer sizes in other embodiments. Cooling loop 41 extends along or within cooler plate surface of cooling plate 39 as will be shown in FIG. 3.

Cooling loop 41 is a pipe, groove, trench or other conduit and extends in a multi-lobe configuration in FIG. 2A but other configurations are used in other embodiments. Cooling loop 41 of FIG. 2A is configured to include multiple lobes that extend outwardly from a central location and are arranged around cooling plate 39. The configuration of cooling loop 41 shown in FIG. 2A represents one configuration only, and cooling loop 41 takes on other shapes in other embodiments such as shown in FIGS. 2B-2F.

Cooling loop 41 and cooling plate 39 are used to cool heater 9 after a film deposition operation has been carried out in some embodiments, and in other embodiments, cooling loop 41 and cooling plate 39 are used to cool heater 9 during the deposition operation, i.e. maintain heater 9 at a desired temperature. When used during the deposition operation, cooling loop 41 and cooling plate 39 maintain heater 9 at a desired temperature and stabilize the deposition process to produce superior grain size uniformity throughout the deposited film.

Cooling plate 39 and cooling loop 41 are characterized by cooling loop 41 occupying an increased area on cooling plate 39. Stated alternatively, the cooling loop 41 is present in a high spatial density on cooling plate 39. In some embodiments, cooling loop 41 occupies an area ranging from about 2.67% to about 14.33% of the area of cooling plate 39 but cooling loop 41 occupies a greater percentage of the area of cooling plate 39 in other embodiments. In another aspect, cooling loop 41 is characterized by extending throughout cooling plate 39 in a high spatial density such as in a serpentine arrangement and such that no location on cooling plate 39 is greater than about 15 or 20 mm from cooling loop 41. The inlet and outlet ports for delivering coolant to and from cooling loop 41 are not shown in FIG. 2A, but it should be understood that various locations and configurations are used for the inlet and outlet coolant ports which are coupled to various chillers in various embodiments. According to various embodiments in which cooling plate 39 has a diameter of about 200 mm, and an area of about 314 cm², the contact area of cooling loop 41 upon cooling plate 39 is at least about 45 cm² but other diameters and other relative areas occupied by cooling loop 41 in cooling plate 39 are used in other embodiments.

Figures 2B, 2C:
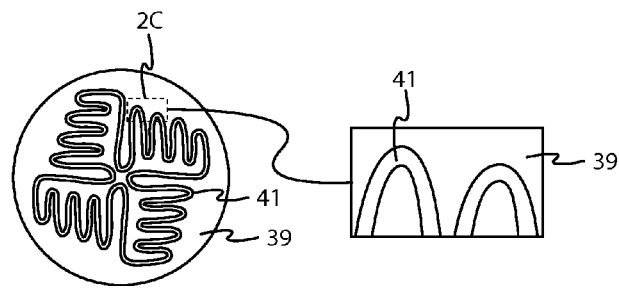
FIG. 2B is a top view of another embodiment of a heater cooling loop according to the disclosure.
FIG. 2C is an exploded, close-up view of a portion of FIG. 2B.
Figures 2D, 2E, 2F:
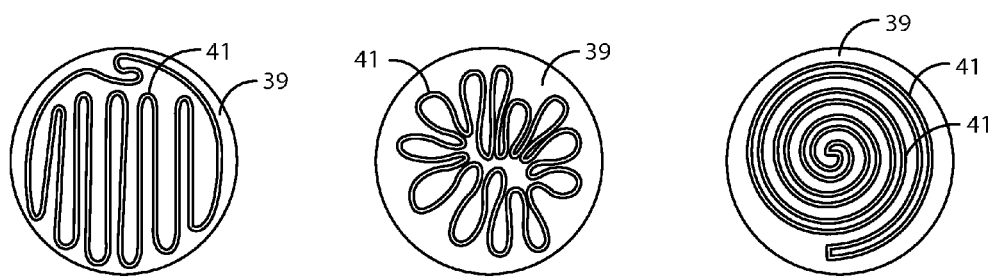
FIG. 2D is a top view of another embodiment of a heater cooling loop according to the disclosure.
FIG. 2E is a top view of another embodiment of a heater cooling loop according to the disclosure.
FIG. 2F is a top view of another embodiment of a heater cooling loop according to the disclosure.

FIG. 2B shows another configuration of cooling loop 41 upon cooling plate 39 in accordance with various embodiments of the present disclosure. FIG. 2C is an expanded, close-up of the indicated portion of FIG. 2B. FIG. 2C shows a portion of cooling loop 41 positioned on the surface of cooling plate 39 in the illustrated configuration, and in the portion shown in FIG. 2C, the area occupied by cooling loop 41 represents about 15-25% of the total area of the cooling plate 39 portion. The percentage of area occupied by cooling loop 41 may vary in other portions of the depiction of FIG. 2B, i.e. the spatial density of cooling loop 41 may vary throughout cooling plate 39. In other embodiments, cooling loop 41 occupies greater percentages of the area of cooling plate 39 such as percentages as high as about 30% or greater. FIGS. 2D, 2E and 2F illustrate other arrangements and configurations of cooling loop 41 on cooling plate 39, and are intended to represent examples and are not limiting of the configurations of cooling loop 41. Each of the configurations shown in FIGS. 2A, 2B, 2D, 2E and 2F can be considered serpentine and the configuration of FIG. 2F includes a plurality of substantially concentric circular or annular-type features. Cooling loop 41 may take on various linear, curvilinear, parabolic, elliptical, arcuate, annular, serpentine, oblong or circular shapes and may include multiple lobes that may be elliptical, oblong, rectangular and have various sizes. In some embodiments such as shown in FIG. 2A, the lobes of the multiple lobes have essentially the same shape and size but in other embodiments, various lobes and parabolic or other shapes of unequal size and unequal arrangement are used in combination to produce the configuration of cooling loop 41.

In FIG. 2B, cooling loop 41 includes multiple parallel portions disposed adjacent one another and in close proximity in one section (quadrant) and an adjacent section including multiple parallel portions in close proximity to one another and orthogonal to the parallel portions in the adjacent portion in an adjacent quadrant. In some embodiments, cooling loop 41 includes a combination of portions that have different or the same shape and the shapes include rectangular, linear curvilinear, parabolic, elliptical, annular, arcuate oblong and circular shapes in various embodiments. In some embodiments, cooling loop 41 is a pipe but other suitable conduits are used in other embodiments.

Figure 3:
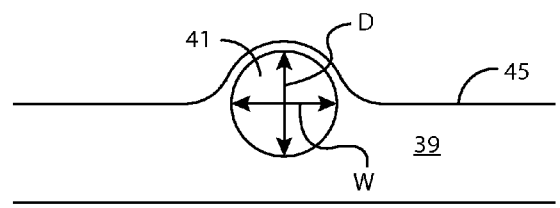
FIG. 3 is a cross-sectional view of a cooling loop within a heater according to an embodiment of the disclosure.

FIG. 3 is a cross-sectional view of a portion of cooling plate 39 that includes cooling loop 41. FIG. 3 shows cooling plate 39 and cooling loop 41. In FIG. 3, cooling loop 41 extends partially beneath upper surface 45 or cooling plate 39. In other embodiments, cooling loop 41 is completely within cooling plate 39, i.e. cooling loop 41 does not extend above upper surface 45 of cooling plate 39. In still other embodiments, cooling loop 41 essentially rests above and is conterminous with cooling plate upper surface 45. Cooling loop 41 includes width W and depth D. In some embodiments, width W is about 0.25 inches, but other widths ranging from about 0.20 inches to about 0.50 inches are used in other embodiments. Depth D is about 12 mm or greater in some embodiments, but other depths ranging from about 10 mm to about 15 mm or greater, are used in other embodiments. Cooling loop 41 is a pipe or other suitable conduit that allows fluid flow therethrough and includes various cross-sectional shapes including circular and elliptical, in various embodiments. Cooling loop 41 includes a cross-sectional area greater than about 110-150 mm² or greater, in some embodiments.

Figure 4:
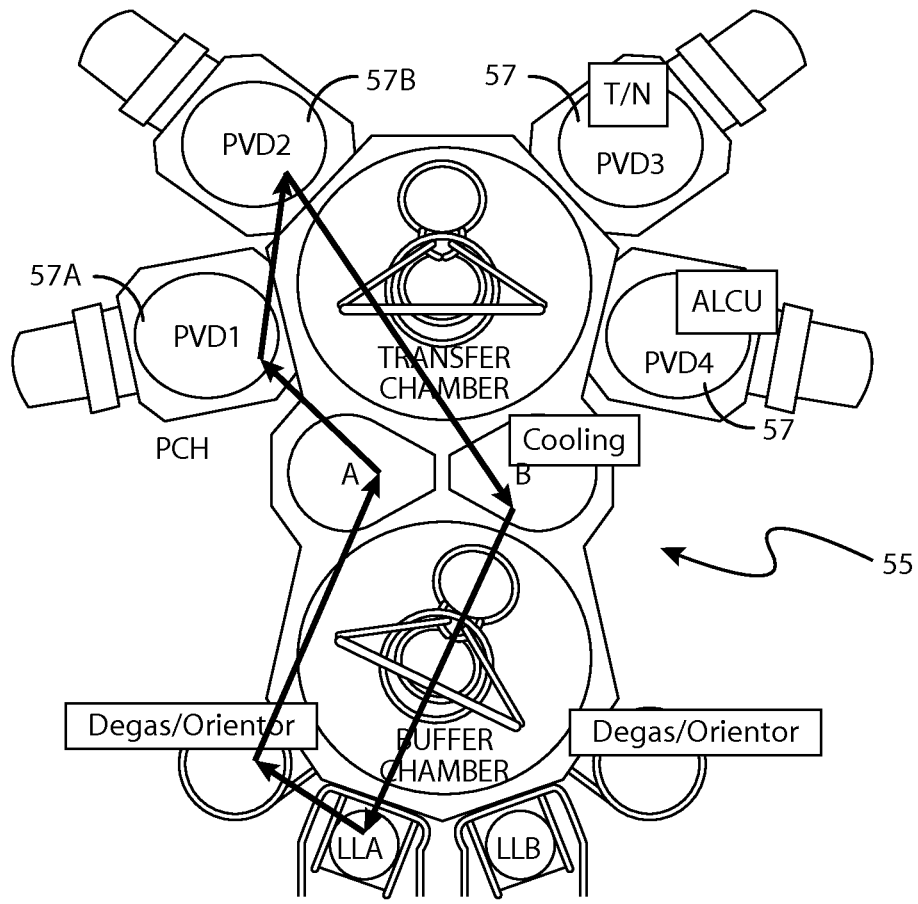
FIG. 4 is a top, plan view of a multi-chamber deposition apparatus including the improved heater cooling loop of the disclosure.

Now turning to FIG. 4, a deposition apparatus according to various embodiments of the disclosure is illustrated. PVD deposition apparatus 55 includes multiple PVD deposition chambers 57 (including deposition chambers 57A and 57B), transfer chamber 59 and buffer chamber 61. An advantage of the disclosure is illustrated by the arrows that represent the movement of a wafer during a complete deposition process according to various embodiments. An advantage of the disclosure is that the deposition of any one particular film takes place in one associated chamber in a continuous deposition operation, regardless of the deposited film thickness.

In FIG. 4, AlCu deposition is carried out first in deposition chamber 57A and then TiN deposition is carried out in deposition chamber 57B. Other arrangements are used in other embodiments and other films are deposited in other embodiments. Other films are deposited in other sequences in other embodiments but an aspect of the disclosure is that the deposition of any one particular film is carried out completely within one chamber in one deposition operation. The improved cooling efficiency of the heater in the deposition chamber 57A, enables the deposition of an aluminum film having a thickness of about 400,000-500,000 angstroms, in some embodiments. Various DC powers, temperatures and deposition times are used. In some embodiments, a DC power as great as 20 Kw or greater may be used and various different materials are deposited from various sputtering targets in various embodiments. The relatively long duration of the deposition process and/or the high power used to deposit the film increases heating and the plasma activity in the chamber and causes the wafer to heat up. During the deposition, the heater, e.g. heater 9 shown in FIG. 1, heats the wafer to a desired temperature. During the PVD deposition operation, various temperatures are used to heat the substrate. Deposition at high powers also results in heating of the wafer temperature. Referring again to FIG. 1, heater 9 may be heated to various temperatures in order for substrate 5 to achieve extremely elevated process temperatures in various deposition embodiments. When used during the deposition operation, the previously described cooling loop and cooling plate maintain heater 9 at a desired temperature and stabilize the deposition process to produce a deposited film with superior uniformity of film thickness and quality including superior grain size uniformity throughout the deposited film.

After the conclusion of the deposition process, including deposition processes that include a lengthy duration and using a power greater than 20 kilowatts, kW, the substrate does not stick to the chamber due to fitted heater cover 7, the improved cooling efficiency of heater 9, and as a result of cooling loop 17 and chamber wall cooling members 25.

The efficient cooling of the heater enables the wafer to be removed from the heater and the deposition chamber safely without any warpage or breakage attributable to portions of the wafer sticking within the deposition chamber. The efficient cooling of the heater also produces a metal film with an improved breakdown voltage, $V_{bd}$, due at least in part to a smaller grain size and superior uniformity including an improved grain size uniformity. In some embodiments, an average grain size of 1.15 um is achieved for one substrate run in a continuous sequence of runs through an apparatus; an average grain size of about 1.24 um is achieved for the 25th substrate run in a continuing sequence of runs through an apparatus and an average grain size of about 1.27 um is achieved for the 50$^{th}$ substrate run in the continuing sequence of runs through an apparatus. Further, grain size uniformity is improved. In some embodiments, a grain size uniformity of about 0.12 um is achieved across a substrate having a size of about 300 mm but other grain size uniformities are achieved in other embodiments.

Figure 5:
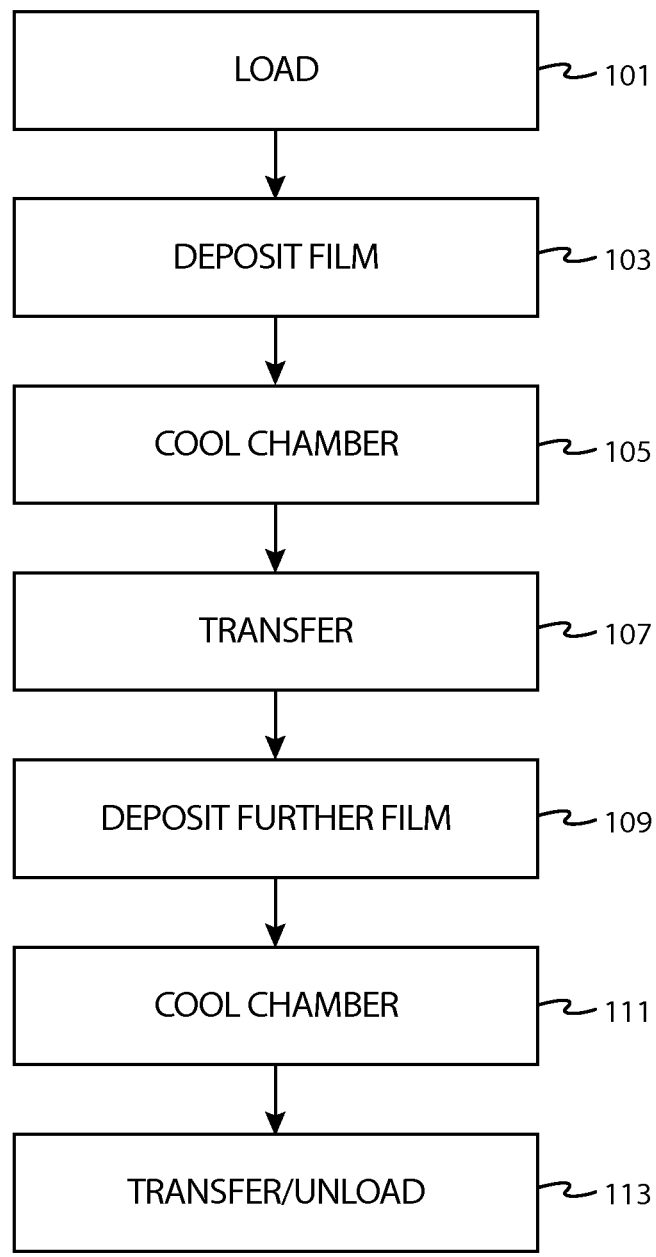
FIG. 5 is a flow chart illustrating a film deposition method according to an embodiment of the disclosure.

FIG. 5 is a flowchart illustrating a film deposition method according to various embodiments of the disclosure. At load step 101, a substrate is provided into a deposition station. The deposition station is a deposition chamber of a multi-deposition chamber PVD, the physical vapor deposition, apparatus in some embodiments. At deposit film step 103, a film is deposited in a deposition operation in one chamber to a thickness of as great as about 400,000-500,000 angstroms or greater. Various materials are sputter deposited in various embodiments. At cool chamber step 105, the heater and chamber are cooled as described above and the wafer is removed from the deposition chamber. At transfer step 107, the wafer is transferred from one deposition chamber to another deposition chamber. At deposit further film step 109, a further film is deposited in a deposition operation in one chamber to a thickness of as great as about 400,000-500,000 angstroms or greater. At cool chamber step 111, the heater and chamber are cooled as described above and the wafer is removed from the deposition chamber. At transfer/unload step 113, the wafer is transferred or unloaded for further processing.

According to one aspect, a film deposition apparatus is provided. The apparatus comprises: a deposition chamber adapted to retain a substrate therein; a target retaining member adapted to retain and provide power to a sputtering target; a heater in the deposition chamber, the heater including a cooling plate including a cooling pipe at least one of therein and thereon, the cooling pipe occupying an area of at least about 14% of an area of the cooling plate; and a heater cover disposed between the heater and the substrate and formed of a stainless steel or ceramic material wherein the heater cover is adapted to receive the substrate thereon.

In one embodiment, the cooling pipe has a configuration including a plurality of lobes coupled to one another and extending around the cooling plate and no location of the cooling plate is greater than about 20 mm from the cooling pipe.

In one embodiment, the cooling pipe includes a depth of about 10-15 mm and a width of greater than 0.25 inches and further comprising at least one further the deposition chamber.

In one embodiment, the cooling plate is substantially the same size as the substrate, and the cooling pipe includes a circular cross-sectional shape and a cross-sectional area greater than about 100-150 mm$^2$.

In one embodiment, the apparatus further comprises a chiller that delivers a coolant to the cooling pipe, the coolant comprising water delivered to the cooling pipe at a temperature of about 10° C.

In one embodiment, the cooling loop is at least one of on and in a surface of the cooling plate and no location of the cooling plate is greater than about 15 mm from the cooling pipe.

In one embodiment, the deposition chamber includes sidewalls with cooling pipes disposed therein or thereon and a cover that further includes cooling pipes therein or thereon, the cover coupled to a sputtering target and each of the cooling pipes having a diameter of about 12-15 mm.

In one embodiment, the cooling pipe occupies an area of at least about 20% of the area of the cooling plate;

In one embodiment, the heater cover is disposed directly on the heater.

In one embodiment, the cooling plate is disposed within the heater.

In one embodiment, the cooling pipe has a configuration being at least one of serpentine and concentric annular rings.

According to one aspect, a film deposition apparatus comprises: a deposition chamber adapted to retain a substrate therein; a target retaining member adapted to retain and provide power to a sputtering target; a heater in the deposition chamber, the heater including a cooling plate substantially the same size as the substrate, the cooling plate including a cooling pipe that extends continuously in a series of lobes extending from a center portion of the cooling plate and disposed around the cooling plate; a heater cover disposed between the heater and the substrate and formed of a ceramic material wherein the heater cover is adapted to receive the substrate thereon; cooling conduits disposed in or on sidewalls of the deposition chamber; and a deposition chamber cover that includes further cooling pipes therein or thereon, wherein the cooling pipe is at least one of on and in a surface of the cooling plate and no location of the cooling plate is greater than about 15 mm from the cooling pipe.

In one embodiment, the cooling plate is disposed inside the heater and the heater cover is adapted to receive the substrate directly thereon.

In one embodiment, the cooling pipe includes a depth of about 10-15 mm and a width of greater than 0.25 inches and the film deposition apparatus includes at least one further of the deposition chambers.

According to one aspect, a method for depositing a film on a substrate is provided. The method comprises: depositing a metal film on a substrate to a thickness of at least about 250K angstroms and using a power of about greater than 15 kw; heating the substrate during the deposition using a heater; providing a cooling plate including a cooling plate surface within the heater; and cooling the heater by flowing a coolant throughout a conduit on the cooling plate surface after the depositing, the conduit occupying about at least 15% of a surface area of the cooling plate.

In one embodiment, the heating comprises positioning the substrate on a heater cover formed of stainless steel and disposed over the heater and the cooling pipe includes a configuration of one of serpentine and a series of substantially concentric annular features.

In one embodiment, the cooling includes the conduit comprising a cooling pipe disposed at least one of on and in the cooling plate surface and wherein the cooling pipe has a cross-sectional area of about 110-150 mm$^2$.

In one embodiment, the cooling includes delivering the coolant at a temperature of about 10° C. to the cooling pipe disposed at least one of on and in the cooling plate surface, the coolant comprising water.

In one embodiment, the cooling includes the conduit comprising a cooling pipe arranged on the cooling plate in a configuration including a plurality of lobes, each extending from a central portion of the cooling plate and coupled to one another and extending around the cooling plate.

In one embodiment, the cooling further takes place during the depositing

The preceding merely illustrates the principles of the disclosure. It will thus be appreciated that those of ordinary skill in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid the reader in understanding the principles of the disclosure and the concepts contributed by the inventors to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of exemplary embodiments, it is not limited thereto. Rather, the appended claims should be construed broadly, to include other variants and embodiments of the disclosure, which may be made by those of ordinary skill in the art without departing from the scope and range of equivalents of the disclosure.

What is claimed is:

1. A film deposition apparatus comprising:
   a deposition chamber adapted to retain a substrate therein;
   a target retaining member adapted to retain and provide power to a sputtering target;
   a heater with a convex upper surface in said deposition chamber, said heater including a cooling plate therein, said cooling plate including a cooling pipe therein or thereon, said cooling pipe occupying an area of at least about 14% of an area of said cooling plate; and
   a heater cover disposed between said heater and said substrate and formed of a stainless steel or ceramic material, said heater cover having a concave lower surface and adapted to receive said substrate on an upper planar cover surface thereof, said concave lower surface configured to receive said convex upper surface of said heater.

2. The film deposition apparatus as in claim 1, wherein said cooling pipe has a configuration including a plurality of lobes coupled to one another and extending around said cooling plate and no location of said cooling plate is greater than about 20 mm from said cooling pipe.

3. The film deposition apparatus as in claim 2, wherein said cooling pipe includes a depth of about 10-15 mm and a width of greater than 0.25 inches and said film deposition apparatus further comprising at least one further said deposition chamber.

4. The film deposition apparatus as in claim 2, wherein said cooling pipe includes a circular cross-sectional shape and a cross-sectional area greater than about 100-150 mm$^2$.

5. The film deposition apparatus as in claim 1, further comprising a chiller that delivers a coolant to said cooling pipe, said coolant comprising water delivered to said cooling pipe at a temperature of about 10° C.

6. The film deposition apparatus as in claim 1, wherein no location of said cooling plate is greater than about 15 mm from a nearest portion of said cooling pipe.

7. The film deposition apparatus as in claim 1, wherein said deposition chamber includes sidewalls with cooling pipes disposed therein or thereon and a cover that further includes cooling pipes therein or thereon, said cover coupled to a sputtering target and each of said cooling pipes having a diameter of about 12-15 mm.

8. The film deposition apparatus as in claim 1, wherein said cooling pipe occupies an area of at least about 20% of said area of said cooling plate;

9. The film deposition apparatus as in claim 1, wherein said heater cover is disposed directly on said heater.

10. The film deposition apparatus as in claim 1, wherein said cooling pipe has a configuration being at least one of serpentine and concentric annular rings.

11. A film deposition apparatus comprising:
    a deposition chamber adapted to retain a substrate therein;
    a target retaining member adapted to retain and provide power to a sputtering target;
    a heater with a convex upper surface in said deposition chamber, said heater including therein a cooling plate sized to receive said substrate and having a planar plate surface and, said cooling plate including a cooling pipe that is disposed partially above and partially below said planar plate surface and extends continuously in a series of lobes extending from a center portion of said cooling plate and disposed around said cooling plate;
    a heater cover disposed between said heater and said substrate, having a concave lower surface configured to receive said convex upper surface of said heater, formed of a ceramic material and adapted to receive said substrate on a planar upper cover surface thereof;
    cooling conduits disposed in or on sidewalls of said deposition chamber; and
    a deposition chamber cover that includes further cooling pipes therein or thereon,
    wherein no location of said cooling plate is greater than about 15 mm from a nearest portion of said cooling pipe and said concave lower.

12. The film deposition apparatus as in claim 11, wherein said heater cover is adapted to receive said substrate directly thereon.

13. The film deposition apparatus as in claim 11, wherein said cooling pipe includes a depth of about 10-15 mm and a width of greater than 0.25 inches and said film deposition apparatus includes at least one further of said deposition chambers.

14. A film deposition apparatus comprising:
    a deposition chamber adapted to retain a substrate therein;
    a target retaining member adapted to retain and provide power to a sputtering target;
    a heater with a convex upper surface in said deposition chamber, said heater including therein a cooling plate sized to receive said substrate, the cooling plate having a planar plate surface and including a cooling pipe disposed partially above and partially below said planar plate surface and that extends continuously in a serpentine shape about said cooling plate;

a heater cover disposed between said heater and said substrate, having a concave lower surface configured to receive said convex upper surface of said heater, formed of a ceramic material and adapted to receive said substrate on a planar upper cover surface thereof;

cooling conduits disposed in or on sidewalls of said deposition chamber; and a deposition chamber cover, wherein no location of said cooling plate is greater than about 15 mm from said cooling pipe.

15. The film deposition apparatus as in claim 14, wherein said cooling pipe includes a depth of about 10-15 mm and a width of greater than 0.25 inches and further comprising at least one further said deposition chamber.

16. The film deposition apparatus as in claim 14, wherein said cooling plate is substantially the same size as said substrate, and said cooling pipe includes a circular cross-sectional shape and a cross-sectional area greater than about 100-150 mm$^2$.

17. The film deposition apparatus as in claim 14, wherein said deposition chamber includes sidewalls with further cooling pipes disposed therein or thereon and said deposition chamber cover further includes further cooling pipes therein or thereon and is coupled to a sputtering target.

18. The film deposition apparatus as in claim 14, wherein said cooling pipe occupies an area of at least about 20% of said area of said cooling plate and said heater cover is disposed directly on said heater.

* * * * *